United States Patent [19]

Thakur

[11] Patent Number: 5,652,181
[45] Date of Patent: Jul. 29, 1997

[54] THERMAL PROCESS FOR FORMING HIGH VALUE RESISTORS

[75] Inventor: Randhir P. S. Thakur, Boise, Id.

[73] Assignee: Micron Display Technology, Inc., Boise, Id.

[21] Appl. No.: 585,084

[22] Filed: Jan. 16, 1996

Related U.S. Application Data

[63] Continuation-in-part of Ser. No. 149,856, Nov. 10, 1993, abandoned.

[51] Int. Cl.⁶ .................. H01L 21/293; H01L 21/321
[52] U.S. Cl. .................. 437/192; 437/193; 437/235; 437/247; 437/918; 148/DIG. 136
[58] Field of Search .................. 437/60, 190, 192, 437/918, 247, 193, 235; 148/DIG. 136; 257/537

[56] References Cited

U.S. PATENT DOCUMENTS

| | | | |
|---|---|---|---|
| 4,288,470 | 9/1981 | Bate et al. | 427/88 |
| 4,533,935 | 8/1985 | Mochizuki . | |
| 4,784,973 | 11/1988 | Stevens et al. | 437/200 |
| 4,791,398 | 12/1988 | Sittler et al. | 338/25 |
| 4,900,257 | 2/1990 | Maeda | 437/60 |
| 5,040,046 | 8/1991 | Chhabra et al. | 437/241 |
| 5,093,710 | 3/1992 | Higuchi | 437/192 |
| 5,188,704 | 2/1993 | Babie et al. | 156/643 |
| 5,188,979 | 2/1993 | Filipiak | 437/192 |
| 5,198,392 | 3/1993 | Fukuda et al. | 437/241 |
| 5,254,493 | 10/1993 | Kumar | 437/60 |
| 5,371,431 | 12/1994 | Jones et al. | 313/309 |
| 5,496,762 | 3/1996 | Sandhu et al. | 437/60 |
| 5,585,301 | 12/1996 | Lee et al. | 437/60 |

FOREIGN PATENT DOCUMENTS

| | | | |
|---|---|---|---|
| 2-219259 | 8/1990 | Japan | 437/918 |

OTHER PUBLICATIONS

Moslehi, M., "Rapid Thermal/Plasma Processing . . ." MRS Sym. Proc. vol. 92, 1987, pp. 73–87.

*Primary Examiner*—T. N. Quach

[57] ABSTRACT

The present invention develops several methods used in a semiconductor fabrication process to form a resistive material having a specific resistive value. A first method uses the steps of: forming a titanium layer over a silicon substrate; and subjecting the titanium layer to a rapid thermal processing cycle. A second method uses the steps of: forming a titanium layer over a silicon substrate; subjecting the titanium layer to a rapid thermal processing cycle; and forming a titanium nitride layer over the thermally processed titanium. A third method uses the steps of: forming an insulating layer over a silicon substrate; forming an undoped polysilicon layer over the insulating layer; forming a titanium layer over the polysilicon layer; subjecting the titanium layer to a rapid thermal processing cycle; and forming a titanium nitride layer over the thermally processed titanium. Additionally, the resistive structure can be capped using a nitride layer.

14 Claims, 4 Drawing Sheets

TABLE 1:

| RTP Process Conditions (intensity, gas flow) | Anneal Time (seconds) | Average Measured $R_S$ (ohm/sq) |
|---|---|---|
| 22.5, $O_2$ = 4 SLPM | 20 | 5.1 G |
| 22.1, $N_2$ = 4 SLPM, $O_2$ = 1 SLPM | 30 | 4.2 G |
| 20.1, Ar = 6 SLPM, $O_2$ = 0.5 SLPM | 20 | 3.8 G |
| 23.1, $N_2$ = 6 SLPM | 20 | 620 K |
| 23.1, $N_2$ = 6 SLPM, $O_2$ = 0.5 SLPM | 20 | 3.5 G |
| 23.1, $N_2$ = 6 SLPM, $N_2O$ = 0.5 SLPM | 20 | 1.1 G |
| 23.1, $N_2$ = 6 SLPM, $N_2O$ = 0.5 SLPM | 5 | 820 K |
| 23.1, $N_2$ = 6 SLPM, $N_2O$ = 0.5 SLPM | 10 | 700 M |
| 23.1, $N_2$ = 6 SLPM, $N_2O$ = 0.5 SLPM | 15 | 850 M |
| 23.1, $N_2$ = 6 SLPM, $N_2O$ = 0.5 SLPM | 7 | 4.84 M |
| 23.1, $N_2$ = 6 SLPM, $N_2O$ = 0.5 SLPM | 8 | 3.5 M |

FIG. 3

THERMAL PROCESS FOR FORMING HIGH VALUE RESISTORS

CROSS REFERENCE TO A RELATED APPLICATION

This application is continuation-in-part to U.S. patent application Ser. No. 08/149,856, filed Nov. 10, 1993 abandoned. U.S. patent application Ser. No. 08/149,856 is hereby incorporated by reference as if set forth in its entirety.

FIELD OF THE INVENTION

This invention relates to semiconductor technology, and more specifically, to a method to form a resistive material having a specific resistive value for use in semiconductor fabrication processes.

BACKGROUND OF THE INVENTION

In the fabrication of semiconductor wafers, sheet resistance has become a driving issue, particularly in current limit/regulation concerns. This has become of particular significance in cold-cathode tip operation in field emission technology as well as in the fabrication of row line formations associated with memory devices, such as Dynamic Random Access Memory (DRAM), Static Random Access Memory (SRAM) and the like. For instance, flat panel displays require well defined resistors to control the cathode emission tip current during operation. Controlling the sheet resistance of the material used is an important aspect in defining the required resistance.

Sheet resistance is defined as the resistance measured across the conductive layer which may typically be positioned across the top of a transistor structure. For example, it is typical in DRAM fabrication to use silicides, such as tungsten silicide ($WSi_x$) and titanium silicide ($TiSi_x$) to form a rowline, which also serves as a gate to an active transistor structure. Standard annealing process steps in forming the conductive layer, such as tungsten silicide ($WSi_x$), superjacent the transistor structure have yielded lowered values of sheet resistance.

Sheet resistance directly correlates with propagation delay, switching speed and device size. This is supported by the principal that the lower the sheet resistance, the greater the number of electrons that will flow. Thus, the size, capacity and speed are all dependent on the electrical characteristics of the conductive layer.

In semiconductor fabrication it is desirable to be able to control the sheet resistance of a conductive and/or insulating layer. However, producing a material that possesses a tight resistance tolerance using a process that can be tightly controlled is a major challenge to process engineers. An effective and controllable method to produce a material having a specific sheet resistance would prove to be very beneficial to many semiconductor fabrication processes.

SUMMARY OF THE INVENTION

A main focus of the present invention is to form a tight tolerance resistance by thermal treatment such as rapid thermal processing for use in semiconductor fabrication. Conventional furnace annealing and plasma annealing can also be used.

An advantage of the process of the present invention lies in the fact that the value of the sheet resistance is independent of the refractory metal film thickness and deposition conditions and can be modulated by bleeding in a regulated amount of atomic oxygen or nitrogen (or a combination of both) during the thermal process. Preferably, RTP or plasma based cluster tools can be used. Also, in-situ film deposition and subsequent annealing can be used. Another advantage with the method of the present invention is the fact that the sheet resistance value remains constant over a wide range of applicable voltages which is particularly useful in the field emissions display technology (e.g. 0–100 V).

Still another advantage of the present invention is that the sheet resistance value obtained is "locked-in" by the use of a capping layer over the refractory metal film.

Still another advantage of the present invention is that this process is easy to integrate into many current fabrication processes that would benefit from forming a layer of material having a tightly controlled sheet resistance.

From a general aspect, the present invention provides a tight tolerance resistance, and particularly refractory metal resistance, by changes due to ambients during RTP.

The present invention is realized by a method used in a semiconductor fabrication process to form a resistive material by the steps of:

forming a refractory metal layer, or a refractory metal nitride layer or a combination of both, over the supporting substrate; and subjecting the refractory metal, refractory metal nitride (or combinations thereof) on the supporting substrate to a thermal processing cycle, thereby forming nitride, oxide or combinations thereof.

BRIEF DESCRIPTION OF THE DRAWING

FIG. 3 depicts Table 1 which shows various sheet resistance values resulting from variations of RTP process conditions;

DETAILED DESCRIPTION OF THE INVENTION

Figure 1:
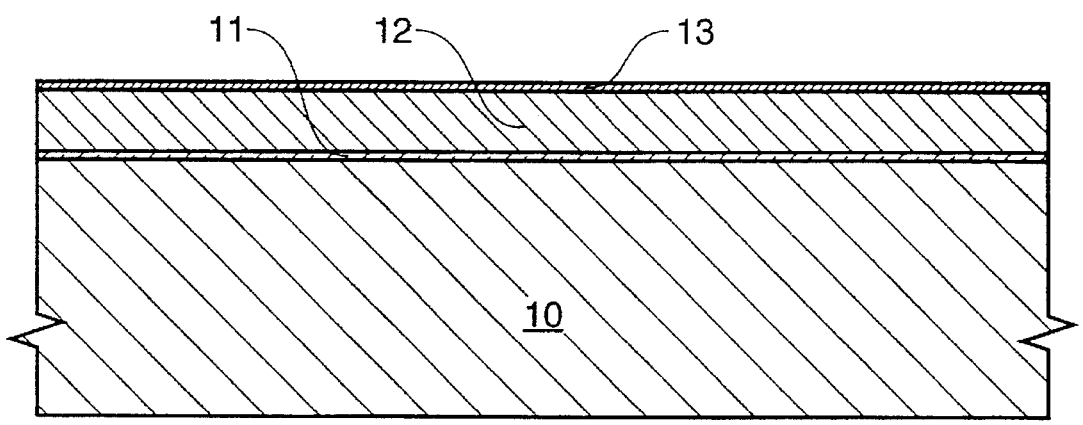
FIG. 1 depicts layer formations used to form a resistance by the process steps of the present invention.
Figure 2:
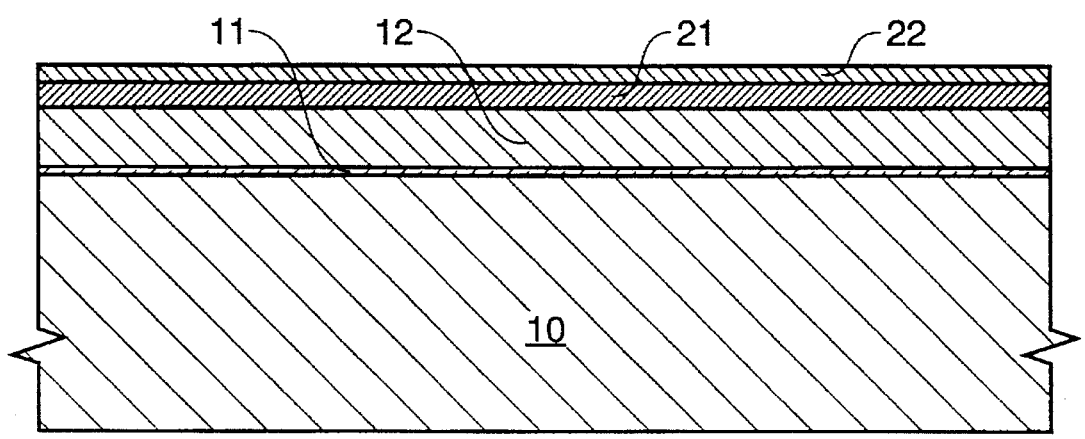
FIG. 2 depicts the resulting resistance after the supporting substrate of FIG. 1 is subjected to thermal processing steps.

The present invention comprises fabrication steps used to form a material having a specific (or tight tolerance) sheet resistance as depicted in FIGS. 1 and 2.

Referring now to FIG. 1, supporting substrate 10, such as silicon, is prepared. Insulating layer 11 is formed over substrate 10 and is followed by the formation of a semiconductive layer 12, such as polysilicon. Next a layer 13 of refractory metal, or refractory metal nitride or a combination thereof, (preferably titanium nitride) is formed over semiconductive layer 12. The presence of insulating layer 11 and semiconductive layer 12 are not necessary to practice the present invention. They do however, represent an approach to obtain the desired results. Also, it is preferred that all layers are formed by chemical vapor deposition (CVD) techniques known to those skilled in the art.

Referring now to FIG. 2, layer 13, residing over semiconductive layer 12 insulation layer 11 and supporting substrate 10 are subjected to a thermal processing step (such as RTP) to form material 21 that has a specific, tight tolerance, sheet resistance. For example, by selective bleeding of $O_2$ or $N_2$ or a combination thereof, over a refractory metal of titanium, $TiO_x$ or $TiN_x$, respectively is formed. It is the composition of the $TiO_x$ or $TiN_x$ that makes the required resistance. Finally, an optional sheet resistance capping layer 22 (i.e., nitride) is formed over material 21. This capping layer prevents the change in resistance due to subsequent fabrication steps, such as annealing, obtained by the above thermal processing step.

In a specific embodiment of the present invention described above, the semiconductor fabrication process steps to form a resistive material having a specific resistive value, are:

forming a refractory metal layer over a supporting substrate; and thermally processing said refractory metal layer at a temperature ranging from 700°–850° C. in the presence of an ambient gas consisting of a combination of nitrogen and oxygen.

The step of thermally processing is performed at a controlled temperature and with a controlled amount of ambient gas such that a desired specific resistive value is formed. This specific resistive value is accomplished by driving a certain amount of impurities from the deposited refractory metal layer which in turn alters the sheet resistance of the refractory metal layer.

As mentioned above, it is preferred that an additional step of, forming a specific resistance capping layer superjacent the thermally processed refractory metal layer is performed, as this capping layer "locks in" the specific resistive value obtained during the thermal step. It is preferred the specific resistance capping layer comprises a nitride of refractory metal layer and specifically it is preferred that the refractory metal used to practice the present invention is titanium. When titanium is selected, it is preferred that the titanium be formed by sputtering or CVD. For the variations of titanium, this would than include sputtered titanium, CVD titanium, CVD titanium nitride, CVD titanium silicide. These CVD formed titanium may all be formed from TiCl4 in CVD chambers or from TDMAT in plasma and RTCVD chambers. Furthermore, for this specific example, the step of thermally processing may be selected from rapid thermal processing, plasma annealing and furnace annealing.

For higher resistance range, in the case of TiN or Ti, $O_2$ is used. For a lower resistance value, traces of $O_2$ or $N_2+N_2O$ are used. This shows that specific concentrations of oxygen leads to a variable resistance at a fixed temperature. Therefore, specific sheet resistance is obtained in accordance with the thermal steps set out in the present invention as described in the several examples that follow.

To form a resistive material having a sheet resistance of approximately 90 KW/sq, the titanium nitride layer of appropriate thickness (i.e., less than 150Å) is subjected to $O_2+N_2$ and $N_2+N_2O$ for 5–10 seconds at a temperature range of 700°–850° C.

To form a resistive material having a sheet resistance of approximately 1.1 GW/sq, the titanium nitride layer is subjected to 6.5 SLPM of $N_2+0.5$ SLPM of oxygen for 5–10 seconds at a temperature range of 700°–850° C. To form a resistive material having a sheet resistance of approximately 4 GW/sq, the titanium nitride layer is subjected to approximately 4 SLPM of nitrogen and approximately 1 SLPM oxygen for 5–10 seconds at a temperature range of 700°–850° C. This demonstrates the role of oxygen incorporation to change the composition of highly reactive refractory metal films.

To form a resistive material having a sheet resistance of approximately 650 KW/sq, the titanium nitride layer is subjected to approximately 2–8 SLPM of nitrogen and approximately 100 sccm–1 SLPM of nitrogen oxide for approximately 5 seconds at a temperature range of 700°–850° C.

Table 1 in FIG. 3 further shows various sheet resistance values resulting from the RTP process conditions presented. For example, in the first row when the RTP process conditions are such that, at 700°–800° C., 4 SLPM of oxygen is bled into the reaction chamber for approximately 20 sec, then the resultant material will possess a sheet resistance of approximately 5.1 GW/sq. The remaining entries in Table 1 are analyzed in the same manner.

All the resistance values described above, as well as those listed in Table 1, are related to a specific refractory metal film at the listed conditions. However, the basic idea is the ambient during thermal treatment can be adjusted such that any specific resistive value desired can be achieved. Furthermore, though Table 1 experiments were achieved through the use of RTP, other thermal treatments like plasma and furnace annealing and choosing appropriate annealing ambients may be used as well.

Figure 4:
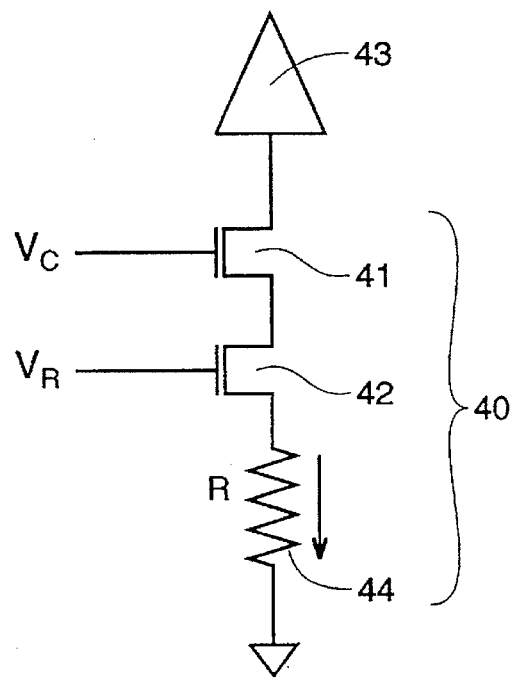
FIG. 4 depicts a schematic representation of current limit/regulation circuitry.

FIG. 4 depicts a schematical representation of current limit/regulation circuitry that may be found in such devices as an emission display (i.e., flat panel display). Column switching transistor 41 and row switching transistor 42 direct pixel emission current to pixel emission tip 43 when these two transistors are selected. A series current limiting resistance 44 is in place to limit and regulate the pixel emission current and complete pixelation circuit 40. The resistance 44 depends on the current requirement of the pixelation circuit 40 and it is critical that resistance 44 be a consistent and uniform value.

Figure 5:
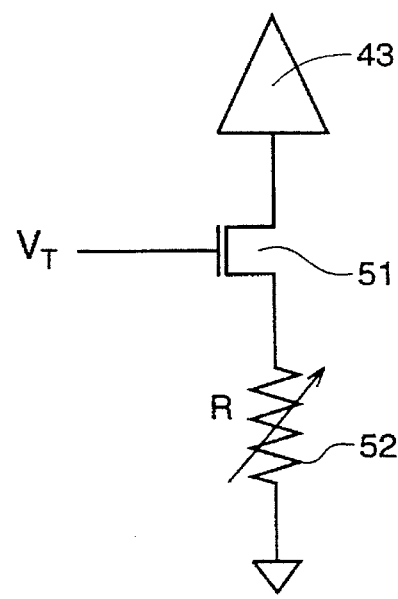
FIG. 5 depicts a schematic representation of a general current limit/regulation switch.

FIG. 5 depicts a schematical representation of basic current limit/regulation circuitry that may be found in semiconductor devices in general. Switching transistor 41 directs current through series current limiting resistance 52 that is in place to limit and regulate the current. Resistance 52 depends on the current requirement of the circuit and it is critical that resistance 52 be a consistent and uniform value.

Figure 6:
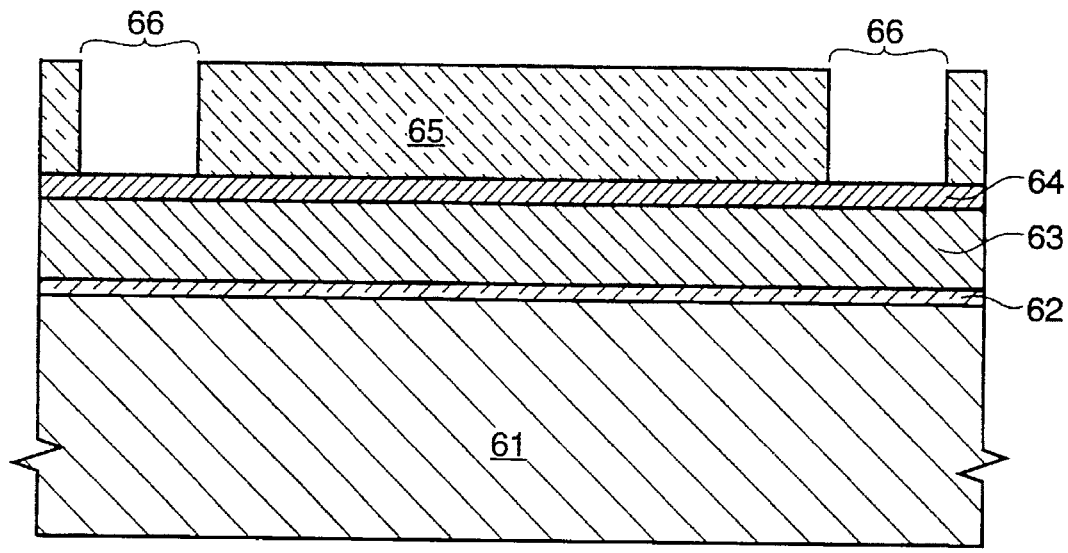
FIG. 6 depicts various process steps used in the formation of the variable resistance of FIGS. 4 and 5.
Figure 7:
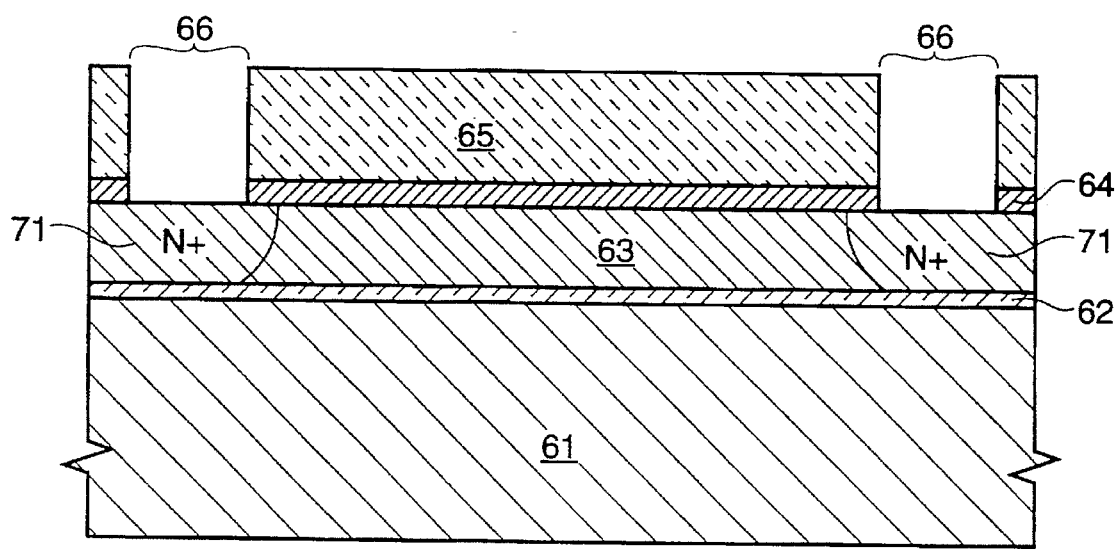
FIG. 7 depicts the resulting resistance after the supporting substrate of FIG. 6 is subjected to thermal processing steps.

The fabrication steps to realize the resistance values shown in FIGS. 4 or 5 begin are shown in FIGS. 6 and 7. Referring now to FIG. 6, a silicon wafer depicted by substrate 61 is covered with an insulating layer 62. A layer of undoped polysilicon (poly) 63 is formed over insulating layer 62. Next, layer 64 of refractory metal laced insulator is formed over poly layer 63 (Preferably, layer 64 will be either titanium nitride or titanium oxide.). A layer of planarized BPSG glass 65 is formed over layer 64 and contact openings 66 are formed through BPSG 65 to expose regions of layer 64.

Referring now to FIG. 7, the wafer is exposed to a thermal processing cycle as described in FIGS. 1 and 2 to provide the desired resistance (such as the values depicted in Table 1 of FIG. 3) at ohmic contact locations 71.

After the desired sheet resistance is obtained by the process steps described in the present invention the supporting substrate is then completed using conventional processing steps used to fabricate the particular semiconductor device desired.

Although the present invention is described in various embodiments, it will be apparent to one skilled in the art that changes and modifications may be made thereto without departing from the spirit and scope of the invention as claimed.

What is claimed is:

1. A semiconductor fabrication process to form a resistive material having a specific resistive value, said process comprising the steps of:

forming a refractory metal layer over a supporting substrate; and thermally processing said refractory metal layer at a temperature ranging from 700°–850° C. in the presence of an ambient gas consisting of a combination of nitrogen and oxygen;

wherein said step of thermally processing is performed at a controlled temperature and with a controlled amount of ambient gas such a desired said specific resistive value is formed by altering the sheet resistance of the refractory metal layer obtained during said step of forming a refractory metal layer.

2. The process of claim 1 further, comprising the additional step of forming a specific resistance capping layer superjacent said thermally processed refractory metal layer.

3. The process of claim 2, wherein said specific resistance capping layer comprises a nitride of said refractory metal layer.

4. The process of claim 1, wherein said refractory metal is converted to a refractory metal nitride.

5. The process of claim 1, wherein said refractory metal is titanium.

6. The process of claim 1, wherein a portion of said refractory metal is converted to a refractory metal nitride.

7. The process of claim 1, wherein said step of thermally processing is a process selected from the group consisting of rapid thermal processing, plasma annealing and furnace annealing.

8. The process of claim 1, wherein said step of forming a said refractory metal layer is a forming method selected from the group consisting of chemical vapor deposition, molecular beam epitaxy, sputtering, and MOCVD.

9. A semiconductor fabrication process to form a resistive material having a specific resistive value, said process comprising the steps of:

forming an insulation layer over a supporting substrate;

forming a semiconductive layer over said insulating layer;

forming a refractory metal layer over said semiconductive layer; and thermally processing the existing material on said supporting substrate at a temperature ranging from 700°–850° C. in the presence of an ambient gas consisting of a combination of nitrogen and oxygen;

wherein said step of thermally processing is performed at a controlled temperature and with a controlled amount of ambient gas such a desired said specific resistive value is formed by altering the sheet resistance of the refractory metal layer obtained during said step of forming a refractory metal layer.

10. The process of claim 9, wherein said step of thermally processing is a process selected from the group consisting of rapid thermal processing, plasma annealing and furnace annealing.

11. The process of claim 9, wherein said forming of all layers comprises depositing these layers by chemical vapor deposition.

12. The process of claim 9, wherein said refractory metal layer is converted to a refractory metal nitride layer.

13. The process of claim 9, wherein a portion of said refractory metal layer is converted to a refractory metal nitride layer.

14. The process of claim 9, wherein said refractory metal is titanium.

* * * * *